(12) United States Patent
Malone

(10) Patent No.: US 6,677,207 B1
(45) Date of Patent: Jan. 13, 2004

(54) VANISHINGLY SMALL INTEGRATED CIRCUIT DIODE

(75) Inventor: Farris D. Malone, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/435,322

(22) Filed: Nov. 4, 1999

Related U.S. Application Data

(60) Provisional application No. 60/107,180, filed on Nov. 5, 1998.

(51) Int. Cl.[7] .................. H01L 21/336; H01L 21/8234; H01L 21/22
(52) U.S. Cl. .................. 438/281; 438/237; 438/564
(58) Field of Search .................. 438/281, 237, 438/542, 564

(56) References Cited

U.S. PATENT DOCUMENTS

| | | | | |
|---|---|---|---|---|
| 4,104,784 A | * | 8/1978 | Klein | |
| 4,387,503 A | * | 6/1983 | Aswell et al. | |
| 4,647,340 A | * | 3/1987 | Szluk et al. | |
| 6,091,114 A | * | 7/2000 | Mogul et al. | |

* cited by examiner

*Primary Examiner*—John F. Niebling
*Assistant Examiner*—Ron Pompey
(74) *Attorney, Agent, or Firm*—Peter K. McLarty; W. James Brady, III; Frederick J. Telecky, Jr.

(57) ABSTRACT

An embodiment of the instant invention is a method of implementing a vanishingly small integrated circuit diode comprising the steps of: forming an area of a thin dielectric film (201 of FIG. 2) over a conductive silicon surface ( 10 of FIG. 2) of one conductivity type in a region of a thick dielectric film (100 of FIG. 2) over the conductive silicon surface; forming a first conductive path from the conductive silicon surface to an operating circuit; forming a conductive silicon film (202 of FIG. 2) of a second conductivity type over the thin dielectric region; forming a second conductive path from the conductive silicon film to the operating circuit; and causing at least one region of the second conductivity type in the conductive silicon surface and at least one third conductive path through the thin dielectric film wherein said causing consists of applying a voltage or applying a current.

16 Claims, 2 Drawing Sheets

VANISHINGLY SMALL INTEGRATED CIRCUIT DIODE

This application claims priority under 35 USC § 119(e)(1) of provisional U.S. application Ser. No. 60/107,180 filed Nov. 5 1998.

FIELD OF THE INVENTION

The invention relates to the field of integrated circuits, and more particular to the implementation of a vanishingly small area diode in an integrated circuit.

BACKGROUND OF THE INVENTION

Diodes are used in a wide variety of integrated circuit applications. One such application is a circuit element that blocks the flow of current in a particular direction. In another application, the diode can be used as a voltage clamp or to provide a reference voltage. Diodes are used to provide electrostatic discharge circuit protection for integrated circuit elements that are particular susceptible to electrostatic damage. In some fast switching integrated circuit applications, diodes with very short switching times are used.

Integrated circuit diodes are typically made by defining a window in a thick field oxide and implanting or diffusing a dopant species such as arsenic, phosphorous, or boron. This results in the formation of a p-n junction diode with an area defined by the capability of the photolithography used to define the window. In addition to photolithography, the implant depth and the amount of diffusion of the species will also determine the size of the diode.

Along with the increasing complexity of integrated circuits there is a corresponding increase in the packing density of the devices making up the circuit. One of the main constraints on the packing density of integrated circuits is the area that each device occupies.

In complex integrated circuit applications diodes with very short switching times are often required. Typically this is accomplished by implanting or diffusing a species which will act to reduce the carrier lifetime in the active diode region. This additional implant and diffusion adds complexity and cost to the process.

Programmable array structures are essential in applications in which there is a need for the circuit to be configured by the end user. This requires a method of forming the structure and/or defining the electrical connections after the processing of the integrated circuit has been completed. Such a structure often requires complex metallization patterns and fusable links.

Accordingly, it would be desirable to implement a very small area programmable diode with a fast switching time without an increase in process complexity or cost.

SUMMARY OF THE INVENTION

The instant invention involves the implementation of a vanishingly small diode with a very short switching time without adding process complexity and cost. In addition, it provides a method for implementing a programmable array diode structure.

An embodiment of the instant invention is a method of forming a vanishingly small diode with short switching times. The method comprises forming an area of a thin dielectric film over a conductive silicon surface of one conductivity type. This thin dielectric area is formed in a region of a thick dielectric film over the conductive silicon surface. A first conductive path is formed from the conductive silicon surface to an operating circuit. A conductive silicon film of a second conductivity type is formed over the thin dielectric region. A second conductive path is formed from the conductive silicon film to the operating circuit. A voltage is applied to the conductive silicon film which is sufficient to form at least one region of the second conductivity type in the conductive silicon surface and at least one third conductive path through the thin dielectric film. Preferably, the conductive silicon film is a polysilicon film.

Another embodiment of the instant invention is a vanishingly small integrated circuit diode with a very short switching time. The diode comprises an area of a thin dielectric film over a conductive silicon surface of one conductivity type in a region of a thick dielectric film over the conductive silicon surface. A first conductive path from the conductive silicon surface to an operating circuit. A conductive silicon film of a second conductivity type over the thin dielectric region and a second conductive path from the conductive silicon film to the operating circuit. A region of the second conductivity type in the conductive silicon surface and a third conductive path through the thin dielectric film that connects the region of the second conductivity type in the conductive silicon surface to the conductive silicon film.

DETAILED DESCRIPTION OF THE INVENTION

Figure 1:
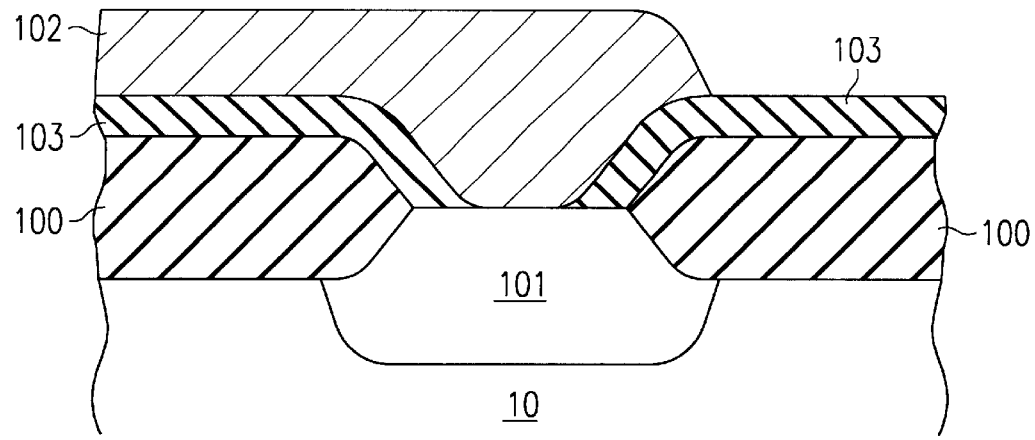
FIG. 1 illustrates a side sectional view of a conventional integrated circuit diode.

A typical integrated circuit diode is illustrated in FIG. 1. It consists of a doped silicon substrate 10 which can either be of the n-type or the p-type conductivity type. Surrounding the diode are areas of a thick dielectric film 100 which provide isolation for the diode from the other components on the silicon surface. The thick dielectric is usually silicon dioxide which is formed on the silicon surface by a thermal oxidation process. The active area of the diode, which is defined by the edges of the thick dielectric film 100, is formed using photolithography. In standard integrated circuit processing, two factors affect the active area of an integrated circuit diode. These are encroachment of the thick dielectric film into the area defined by photolithography, and diffusion of the dopant species introduced to form the diode. This dopant species is introduced using ion implantation or thermal diffusion from a source gas and will result in a region of opposite conductivity type 101 to that of the silicon surface. After the introduction of the dopant species into the silicon surface, thermal processing is required to activate the dopant species. This thermal process causes the dopant species to diffuse into the silicon surface 10 resulting in an increase in the active diode area. To provide electrical contact to the diode addition dielectric films are formed 103, a contact window opened, and a metal film 102 used to fill the window and contact the diffused region 101.

Figure 2:
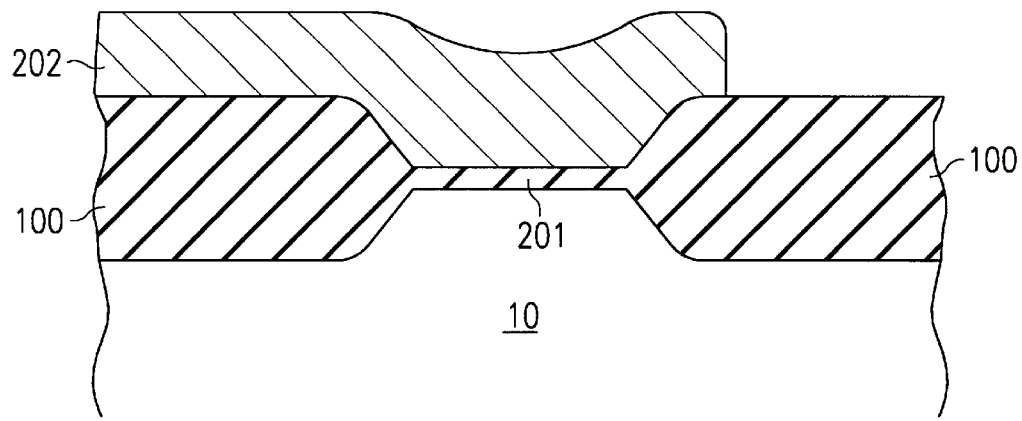
FIG. 2 shows a side sectional view of a particular embodiment of the instant invention before the application of a voltage pulse.

The instant invention will be described by referring to FIGS. 2 and 3. Referring to FIG. 2, a conductive semiconductor surface of a particular conductivity type is provided 10. The conductivity of the semiconductor surface 10 being either be n-type or p-type. A thick dielectric region 100 is formed on the semiconductor surface 10 and an opening is formed in the thick dielectric region. A thin dielectric film 201 is formed on the semiconductor surface in the opening. In an embodiment of the instant invention the thin dielectric film is comprised of a material selected from the group consisting of silicon dioxide, silicon oxynitride, silicon nitride, and any combination thereof. In addition the thin dielectric film can comprise a plurality of films selected from the group consisting of silicon dioxide, silicon oxynitride, silicon nitride, and any combination thereof. A layer of silicon containing material 202 is formed over the thick dielectric film 100 and the thin dielectric film 201. Preferably, this silicon-containing material is comprised of polycrystalline silicon ("poly" or "polysilicon"), but it may be comprised of epitaxial silicon or any other semiconducting material. A dopant is preferably introduced into the silicon-containing material so as to increase the conductivity of the silicon-containing material. This is preferably followed by an anneal step so as to drive the dopant into the silicon-containing material. The dopant introduced into the silicon-containing material must be of the opposite type to that in the conductive silicon surface 10. Thus, if a n-type dopant is used in the silicon surface then a p-type dopant must used in the silicon-containing material 202. Also, if a p-type dopant is used in the silicon surface 10 then a n-type dopant must be used in the silicon-containing material. The silicon surface 10 and the silicon-containing layer 202 are both connected to an operating circuit via separate conducting paths. Preferably, these conducting paths will consist of lines that are made to contact the silicon surface 10 and the silicon-containing material 202. These conducting paths can be formed using polysilicon, aluminum, copper, titanium, tungsten, titanium nitride or any combination of these and other materials that result in lines of low resistivity. In addition to connecting the structure to an operating circuit, the conducting paths can be used to connect the structure to bond pads for connection to structures external to the integrated circuit.

Figure 3:
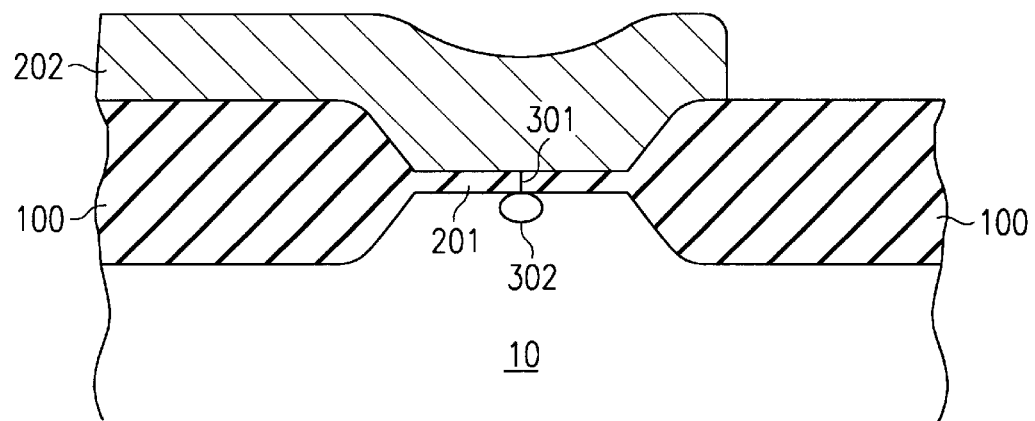
FIG. 3 shows a side sectional view of the formation of the small area fast switching time diode structure.

Referring to FIG. 3, a voltage or current is applied to the silicon-containing layer 202 and the silicon surface 10 such that the silicon surface directly beneath the thin dielectric film 201 becomes accumulated with majority carriers. In applying a voltage, as this voltage is increased, current will begin to flow through the oxide. This current will be the Fowler-Nordheim current, tunneling current, or current due to some other mechanism. Increasing the voltage above a critical value will result in the formation of a conductive path 301 in the thin dielectric film 201 and a doped region 302 in the semiconductor surface 10.

This critical value of voltage is an important criteria in determining the relationship between the thick dielectric film 100 and the thin dielectric film 201. The thickness of the thick dielectric film 100 must be such that at the critical voltage no current flows through the thick dielectric film 100. In addition, the thin dielectric region 201 must be of a thickness to minimize the current component due to direct tunneling the flows through the thin dielectric film 201.

Alternatively, if a current is applied, an increase in the value of the current will result in an increase in the voltage across the structure. At some critical value of current the conductive path 301 and the doped region 302 will form.

In another embodiment, a constant voltage or current can be applied. In this case after a certain critical time the conductive path 301 and the doped region 302 will form. In all cases, the resulting doped region 302 that is formed will be of the same conductivity type as the silicon-containing layer 202. The size of the doped region 302 will be determined to a first order by the size of the conductive path. Although the exact mechanism of the process in not well understood, it is believed the size of the conductive will be on the order of defect structures in the thin dielectric 201.

In another embodiment of the instant invention, the structure shown in FIG. 3 is repeated to form an array with separate conductive paths to each silicon-containing layer. The diode formation process can then be carried out at any time by simply applying the critical voltage to the conductive path connected to the silicon-containing layer in the position where the diode is to be formed.

Figure 4:
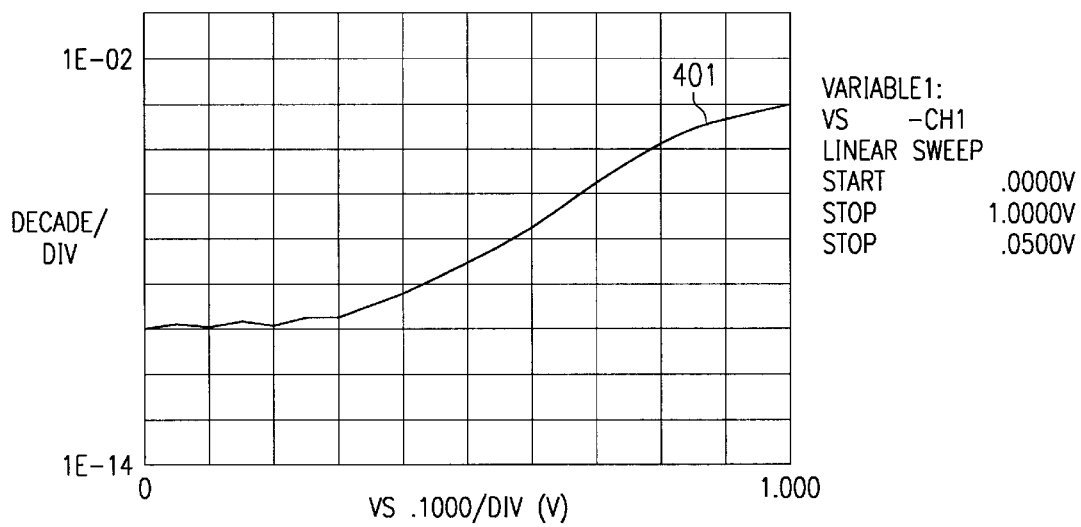
FIG. 4 shows the forward current characteristic for a diode of the instant invention.
Figure 5:
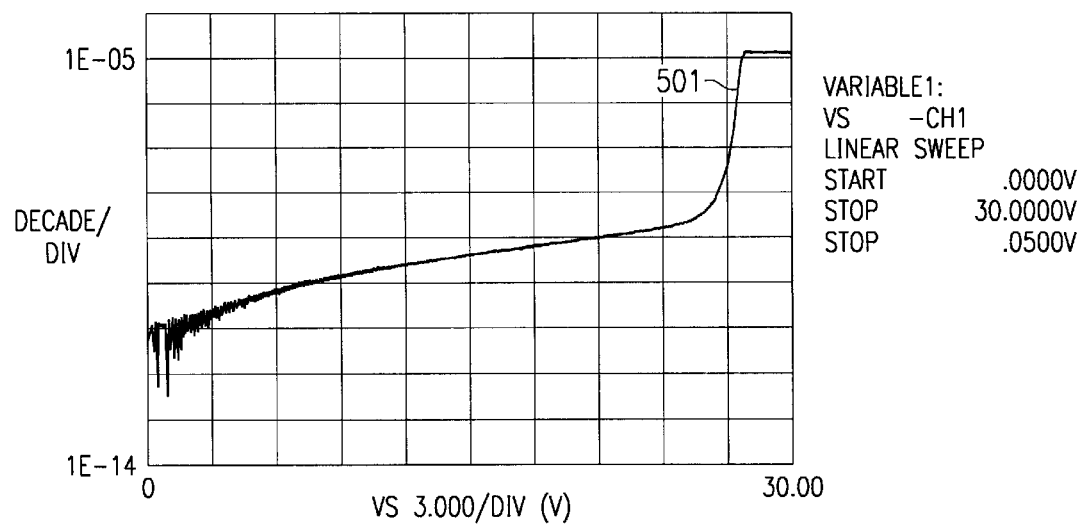
FIG. 5 shows the reverse current characteristic for a diode of the instant invention.

Illustrated in FIG. 4 is the forward current characteristic 401 of a diode of the instant invention. The reverse current characteristic 501 of the diode is shown in FIG. 5. For this structure, the silicon surface 10 was boron doped, and the silicon-containing layer 202 was phosphorous doped polysilicon.

The diodes implemented using the instant invention have a very short switching time. The mechanism that results in this short switching time is not well understood, but is believed to be related to damage produced at the silicon surface 10 during the formation of the conductive path 301 and the doped region 302.

Although specific embodiments of the present invention are herein described, they are not to be construed as limiting the scope of the invention. Many embodiments of the present invention will become apparent to those skilled in the art in light of the methodology of the specification. The scope of the invention is limited only by the claims appended.

I claim:

1. A method of forming a diode comprising:
   forming an area of a thin dielectric film over a conductive silicon surface of one conductivity type in a region of a thick dielectric film over the conductive silicon surface of one conductivity type;
   forming a conductive silicon film of a second conductivity type over the thin dielectric region;
   causing at least one region of the second conductivity type in the conductive silicon surface; and
   causing at least one conductive path through the thin dielectric film.

2. The method of claim 1, wherein said thick dielectric film is silicon dioxide.

3. The method of claim 1, wherein said thin dielectric film is comprised of a material selected from the group consisting of silicon dioxide, silicon oxynitride, silicon nitride, and any combination thereof.

4. The method of claim 1, wherein said thin dielectric film is a plurality of films selected from the group consisting of silicon dioxide, silicon oxynitride, silicon nitride, and any combination thereof.

5. The method of claim 1, wherein said conductive silicon film is comprised of a material selected from the group consisting of: doped polysilicon, undoped polysilicon, epitaxial silicon, and any combination thereof.

6. The method of claim 1, wherein said causing consists of applying a voltage.

7. The method of claim 1, wherein said causing consists of applying a current.

8. A method of forming a diode comprising:
   forming region of a thick dielectric film over a conductive silicon surface of one conductivity type;

forming an area of a thin dielectric film over said conductive silicon surface of one conductivity type in said region of said thick dielectric film;

forming a first conductive path from the conductive silicon surface to an operating circuit;

forming a conductive silicon film of a second conductivity type over the thin dielectric region;

forming a second conductive path from the conductive silicon film to the operating circuit; and causing at least one region of the second conductivity type in the conductive silicon surface and at least one third conductive path through the thin dielectric film by applying a voltage difference across the first conductive path and the second conductive path.

9. The method of claim 8, wherein said thick dielectric film is silicon dioxide.

10. The method of claim 8, wherein said thin dielectric film is comprised of a material selected from the group consisting of silicon dioxide, silicon oxynitride, silicon nitride, and any combination thereof.

11. The method of claim 8, wherein said thin dielectric film is a plurality of films selected from the group consisting of silicon dioxide, silicon oxynitride, silicon nitride, and any combination thereof.

12. The method of claim 8, wherein said first conductive path is comprised of a material selected from the group consisting of doped polysilicon, aluminium, copper, titanium, tungsten, titanium nitride, and any combination thereof.

13. The method of claim 8, wherein said conductive silicon film is comprised of a material selected from the group consisting of: doped polysilicon, undoped polysilicon, epitaxial silicon, and any combination thereof.

14. The method of claim 8, wherein said second conductive path is comprised of a material selected from the group consisting of doped polysilicon, aluminum, copper, titanium, tungsten, titanium nitride, and any combination thereof.

15. The method of claim 8, wherein said causing consists of flowing an electric current through the first conductive path and the second conductive path.

16. The method of claim 8, wherein said causing consists of flowing an electric current through the thin dielectric film.

* * * * *